United States Patent
Bhatia et al.

(10) Patent No.: US 7,253,688 B2
(45) Date of Patent: Aug. 7, 2007

(54) INPUT MATCHING CIRCUIT FOR MULTIBAND LOW NOISE AMPLIFIER

(75) Inventors: Rahul Bhatia, Irvine, CA (US); Sang-Hyun Woo, Seoul (KR); Ji-Hoon Bang, Seongnam-si (KR); Seong-Soo Lee, Suwon-si (KR); Chang-Ho Lee, Marietta, GA (US); Joy Laskar, Atlanta, GA (US)

(73) Assignees: Samsung Electronics Co., Ltd. (KR); Georgia Tech Research Corporation, Atlanta, GA (US)

( * ) Notice: Subject to any disclaimer, the term of this patent is extended or adjusted under 35 U.S.C. 154(b) by 83 days.

(21) Appl. No.: 11/088,591

(22) Filed: Mar. 24, 2005

(65) Prior Publication Data
US 2005/0225397 A1    Oct. 13, 2005

Related U.S. Application Data

(60) Provisional application No. 60/555,684, filed on Mar. 24, 2004.

(30) Foreign Application Priority Data
Dec. 31, 2004    (KR) .................. 10-2004-0118153

(51) Int. Cl.
*H03F 3/191*    (2006.01)
*H03F 1/22*    (2006.01)
(52) U.S. Cl. .................... 330/302; 330/311
(58) Field of Classification Search ......... 330/283, 330/294, 302, 311
See application file for complete search history.

(56) References Cited

U.S. PATENT DOCUMENTS

| | | | |
|---|---|---|---|
| 4,114,105 A | * | 9/1978 | Duncan ............ 455/223 |
| 5,117,203 A | * | 5/1992 | Tennyson ............ 330/294 |
| 6,586,993 B2 | * | 7/2003 | Macedo ............ 330/51 |

OTHER PUBLICATIONS

Sharaf et al, "A Compact Approach for the Design of a Dual-Band Low-Noise Amplifier", pp. 890-893, 2001 IEEE.
Lee et al., "A SiGe Low Noise Amplifier for 2.4/5.2/5.7 GHz WLAN Applications", 2003 IEEE.

* cited by examiner

*Primary Examiner*—Steven J. Mottola
(74) *Attorney, Agent, or Firm*—The Farrell Law Firm

(57) ABSTRACT

Provided is a multiband low noise amplifier including a first transistor, an input matching circuit, and a first capacitor. The first transistor includes a collector electrically connected to a first power supply, a grounded emitter, and a base connected to the other end of a first inductor having one end as an input end of the low noise amplifier. The input matching circuit is connected between the collector and the base of the first transistor. The first capacitor connected to the collector of the first transistior. The input matching circuit includes a varactor. The input matching circuit includes a second capacitor connected to the varactor. The input matching circuit includes a first resistor connected to the varactor. In the multiband low noise amplifier, a varactor having a variable capacitance is installed at an input end, thereby easily performing band switching through bias voltage control by a small amount and minimizing noises that may be caused by a control signal.

8 Claims, 4 Drawing Sheets

INPUT MATCHING CIRCUIT FOR MULTIBAND LOW NOISE AMPLIFIER

PRIORITY

This application claims priority under 35 U.S.C. § 119 to an application entitled "Input Matching Circuit for Multiband Low Noise Amplifier" filed in the United States Patent and Trademark Office on Mar. 24, 2004 and assigned Ser. No. 60/555,684, and an application entitled "Input Matching Circuit for Multiband Low Noise Amplifier" filed in the Korean Intellectual Property Office on Dec. 31, 2004 and assigned Serial No. 2004-118153, the contents of both of which are incorporated herein by reference.

BACKGROUND OF THE INVENTION

1. Field of the Invention

The present invention relates generally to a multiband low noise amplifier, and in particular, to an input matching circuit for a multiband low noise amplifier.

2. Description of the Related Art

In a wireless communication system such as a wireless telephone, a number of electronic components for transceiving signals through a wireless medium are used. For example, a transceiver transmits and receives signals in a wireless telephone. One of the elements that is closest to a wireless interface in a signal path of the transceiver is referred to as a front end of the transceiver. At the front end of the transceiver, various components such as an antenna, a power amplifier (PA), an isolator, a low noise amplifier (LNA), and a multiplexer are arranged. Among such components, the PA or LNA includes active components and internal input and output matching circuits for controlling an input or output resistance.

A matching circuit is used to match impedances between components to avoid or reduce power loss during signal transmission. In particular, in the LNA, an impedance transfer circuit is used to maintain optimal noise impedance matching between an input signal source and an active component selected for the LNA.

Where there is the coexistence of systems following different wireless communication standards in different locations and various applications are used for such systems, there is a need for a receiver capable of operating in various frequency bands.

For example, various versions of the wireless LAN (WLAN) standards such as the Institute of Electrical and Electronic Engineers (IEEE) 802.11a, 802.11b, and 802.11g have been developed or have come into use, and the versions have different characteristics from one to another. For example, 802.11b operates in the 2.4 GHz band and provides a data rate of 11 Mbps, and 802.11a supports a data rate of 54 Mbps in the 5 GHz band, and 802.11g provides a data rate of up to 54 Mpbs in the 2.4 GHz band using Orthogonal Frequency Division Multiplexing (OFDM).

In such an environment where systems that provide different data rates in different frequency bands coexist, a terminal capable of operating in multiple bands and multiple modes is required to provide a user with high-speed data services and compatibility between systems.

A multiband, multimode transceiver is designed based on the costs, the number of additional components, and a switching mechanism upon its performance. For example, the multiband, multimode transceiver may be configured using independent wireless paths for respective frequency bands, simultaneous reception in different frequency bands, a switched inductor for selection from among the different frequency bands, and a bias current for selection from among the different frequency bands.

FIG. 1 is a block diagram of a conventional dual-band receiver. Referring to FIG. 1, signals received through two antennas pass through first band selection filters 112 and 122, respectively, are amplified by LNAs 113 and 123, pass through image reject filters 114 and 124, are selected by channel selection filters 115 and 125, and are then converted into a common intermediate frequency. In this structure, an analog-to-digital converter (ADC) 106 and a digital signal processor (DSP) 107 are shared. As a result, a number of expensive external components are required, more space is required to mount such external components, and manufacturing costs increase. Since there is a trade-off between image rejection and channel selection, double down conversion mixing is required for each path, resulting in increases in complexity and power consumption.

FIG. 2 is a block diagram of a dual-band receiver using a conventional Weaver architecture. The frequency of a first local oscillator 203 is set to an intermediate value between the bands of two duplexers 211 and 221. Band selection switches 212 and 222 that are connected to the duplexers 211 and 221, respectively, perform mode transition between two operation modes (GSM and DCS) and close a wireless path in an idle band to reduce power consumption. Outputs from the band selection switches 212 and 222 pass through band pass filters 213 and 223, and their image components are rejected and a request signal is acquired through an addition or subtraction operation of a band selection switch 205. However, the dual-band receiver using a conventional Weaver architecture does not provide sufficient image rejection and requires a large mounting space, causing an increase in manufacturing costs. Moreover, although the dual-band receiver using a conventional Weaver architecture is smaller than the dual-band receiver of FIG. 1, it consumes much power.

Unlike such dual-band receivers using two LNAs, a dual-band receiver using an LNA has been suggested in "A Compact Approach for the Design of a Dual-Bnd Low-Noise Amplifier" by Sharaf, K. M. and EIHAK, H. Y. in MWSCAS 2001, pp. 890-893. The suggested dual-band LNA is configured to include as a minimum number of components as possible. In this approach, band selection is made by three switches, and input/output matching, gains, and noise filtering are superior. However, performance degradation may occur due to noises caused by the switches and the complexity of controlling the switches and a mounting space is relatively large.

Another dual-band LNA has been suggested in "A SiGe Low Noise Amplifier for 2.4/5.2/5.7 GHz WLAN Application" by Po-Wei Lee and Hung-Wei Chiu, et al. in ISSCC 2003, pp. 264-366. In this approach, a base-emitter capacitance and a Miller capacitance function as a bias current by a base-collector capacitance and a resonance frequency for input matching can be changed by controlling an input capacitance. Such a SiGe LNA structure provides simple bias switching and requires a small mounting space. However, a change in the bias current brings about unfavorable changes in a direct current condition, leading to performance degradation.

SUMMARY OF THE INVENTION

It is, therefore, an object of the present invention to provide a dual-band low noise amplifier for minimizing the number of components constituting a circuit without compromising amplification performance of multiband signals.

To achieve the above and other objects, there is provided a multiband low noise amplifier comprising a first transistor, an input matching circuit, and a first capacitor. The first transistor includes a collector electrically connected to a first power supply, a grounded emitter, and a base connected to the other end of a first inductor having one end as an input end of the low noise amplifier. The input matching circuit is connected between the collector and the base of the first transistor. The first capacitor connected to the collector of the first transistior.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A multiband low noise amplifier according to a preferred embodiment of the present invention will now be described in detail with reference to the annexed drawings.

Figure 1:
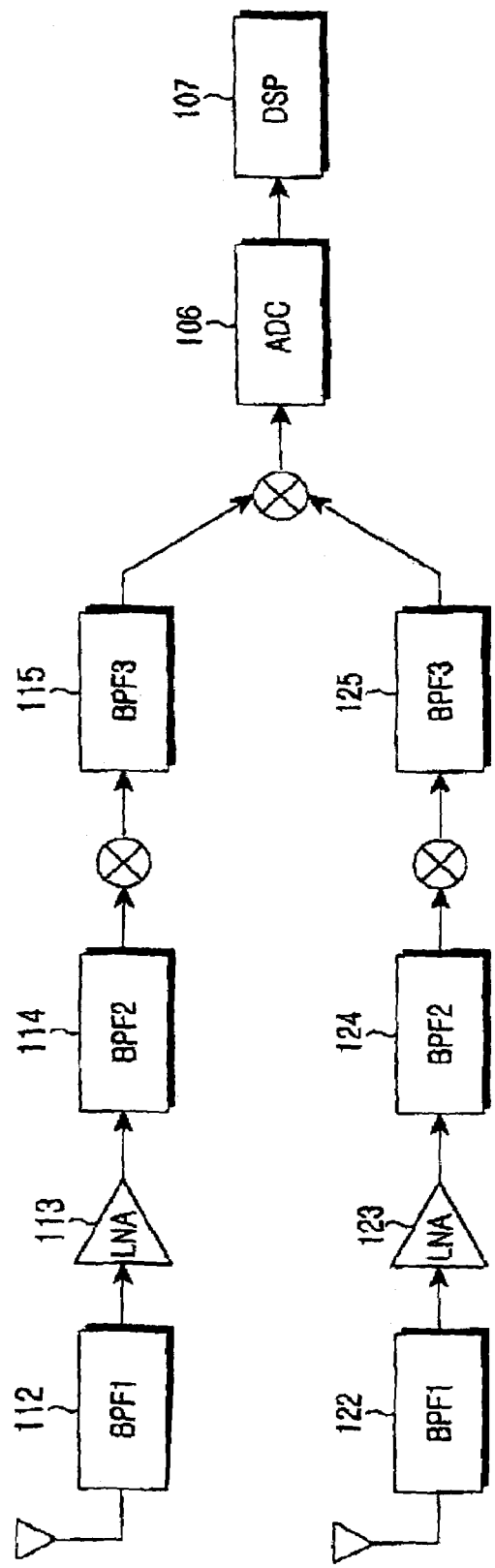
FIG. 1 is a block diagram of a conventional dual-band receiver.
Figure 2:
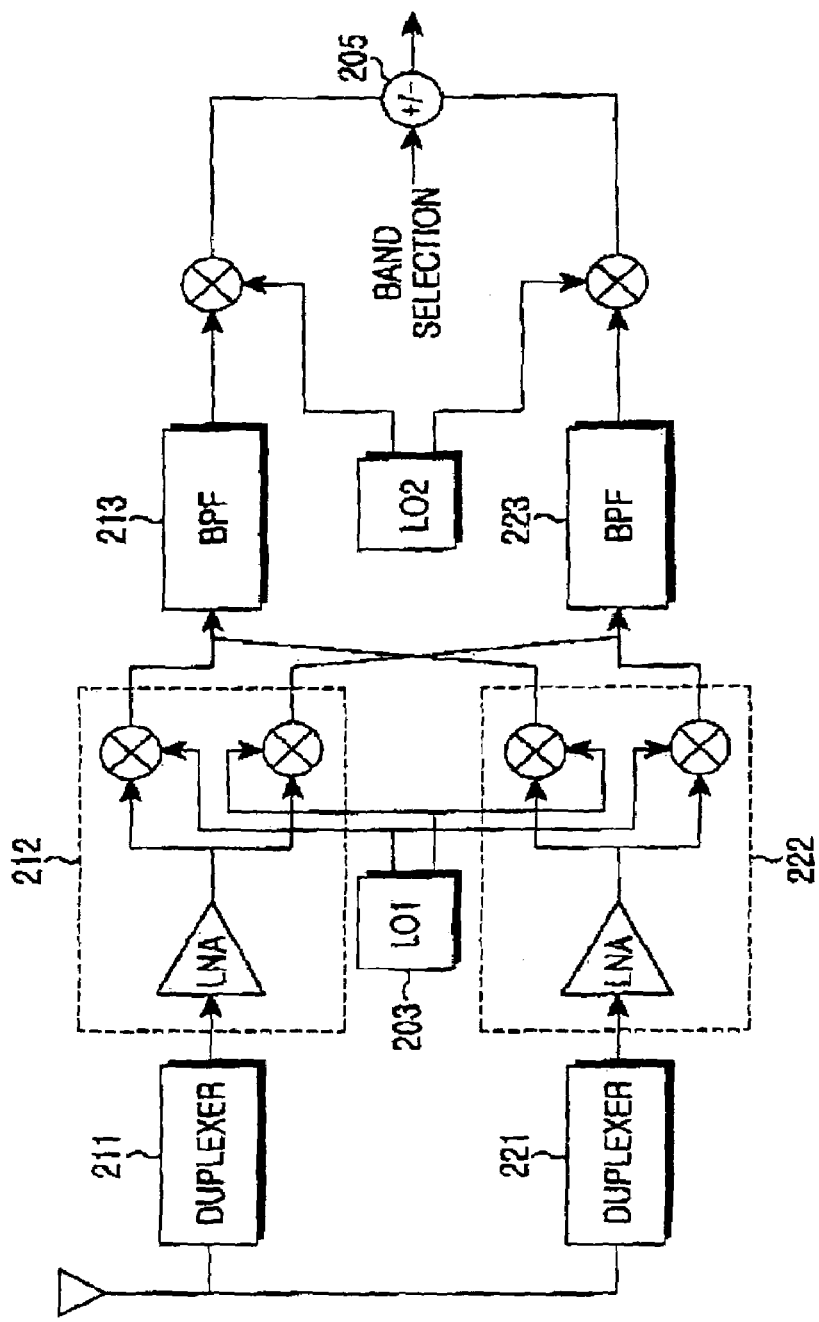
FIG. 2 is a block diagram of a dual-band receiver using a conventional Weaver architecture.
Figure 3:
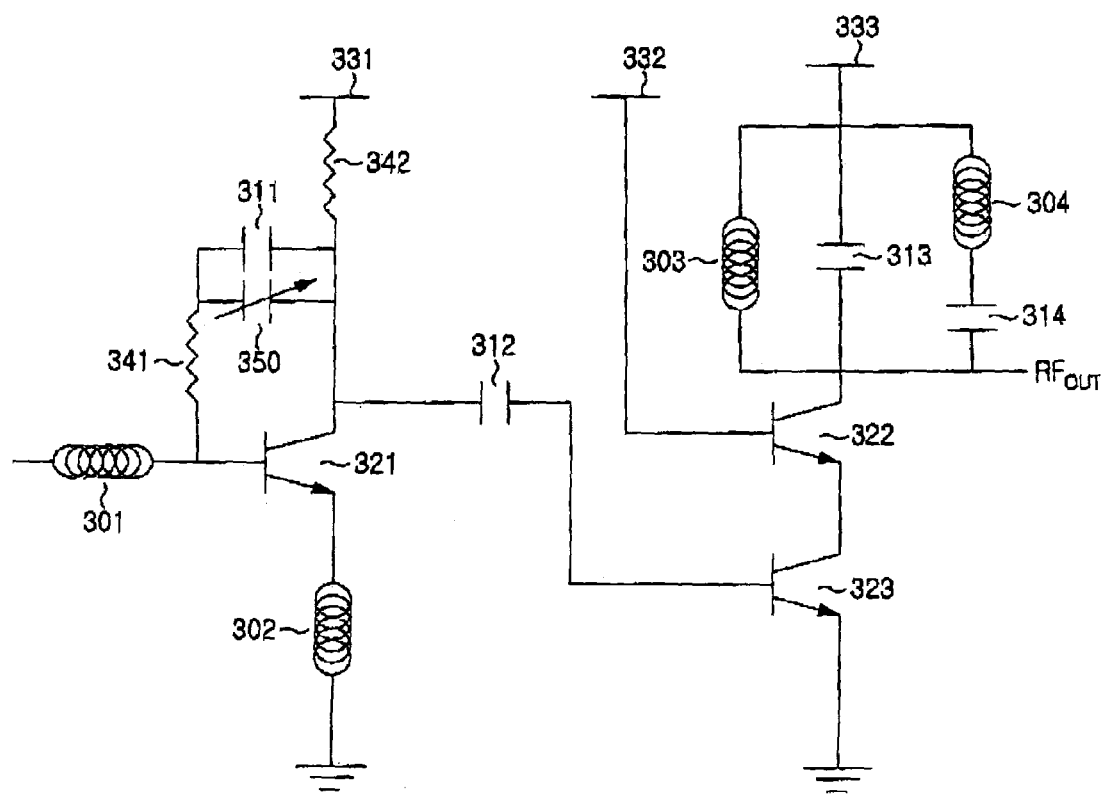
FIG. 3 is a circuit diagram of a multiband low noise amplifier according to a preferred embodiment of the present invention.

FIG. 3 is a circuit diagram of a multiband low noise amplifier according to a preferred embodiment of the present invention.

A multiband low noise amplifier according to a preferred embodiment of the present invention includes a first inductor 301, a first resistor 341, a first capacitor 311, a varactor 350, a first power supply 331, a second resistor 342, a first transistor 321, a second inductor 302, a second capacitor 312, a second power supply 332, a third inductor 303, a third power supply 333, a third capacitor 313, a second transistor 322, a third transistor 323, a fourth inductor 304, and a fourth capacitor 314.

As shown in FIG. 3, the first transistor 321 includes an emitter grounded through the second inductor 302, a collector connected to the first power supply 331 through the second resistor 342, and a base connected to one end of the first inductor 301. The other end of the first inductor 301 is connected to an input node.

The cascaded first resistor 341 and first capacitor 311 are connected in series between the base and collector of the first transistor 321. The varactor 350 is connected in parallel to the first capacitor 311. The collector of the first transistor 321 is connected to an input end of the second capacitor 312.

The second transistor 322 includes a base connected to the second power supply 332, an emitter connected to a collector of the third transistor 323, and a collector connected to the third power supply through the third capacitor 313. The third transistor 323 includes a base connected to an output end of the second capacitor 312 and a grounded emitter.

The third inductor 303 is connected in parallel with the third capacitor 313, and the cascaded fourth inductor 304 and fourth capacitor 314 are connected in series with each other and in parallel with the third capacitor 313.

The varactor 350 is electrically connected to an external controller (not shown) and operates according to a signal input from the external controller. The varactor 350 operates according to a bias voltage input from the external controller. The first capacitor 311 is connected in parallel to the varactor 350 to compensate for a control voltage applied to the varactor 350.

The capacitance of the varactor 350 is determined according to the level of the control voltage input from the external controller, and the resonance frequency of an impedance input to the first inductor 301 and the base of the first transistor 321 is switched according to the capacitance of the varactor 350. In this way, reception band switching between multiple frequency bands is performed.

The first resistor 341 connected in series to the first capacitor 311 is used to prevent a reverse flow of current.

Since a small change in the capacitance of the varactor 350 may cause a significant change in an input capacitance, multiple broadband input matching can be achieved by controlling a bias voltage input to the varactor 350.

A signal received through a frequency band selected in the above manner passes through a noise canceling circuit connected to the output side of the second capacitor 312 and is output through an output end RFout. Herein, the noise canceling circuit is comprised of the second transistor 322, the third transistor 323, the third inductor 303, the third capacitor 313, the fourth inductor 304, the fourth capacitor 314, and the third power supply 333. The noise canceling circuit may be optionally installed for the effect of reverse isolation.

Figure 4:
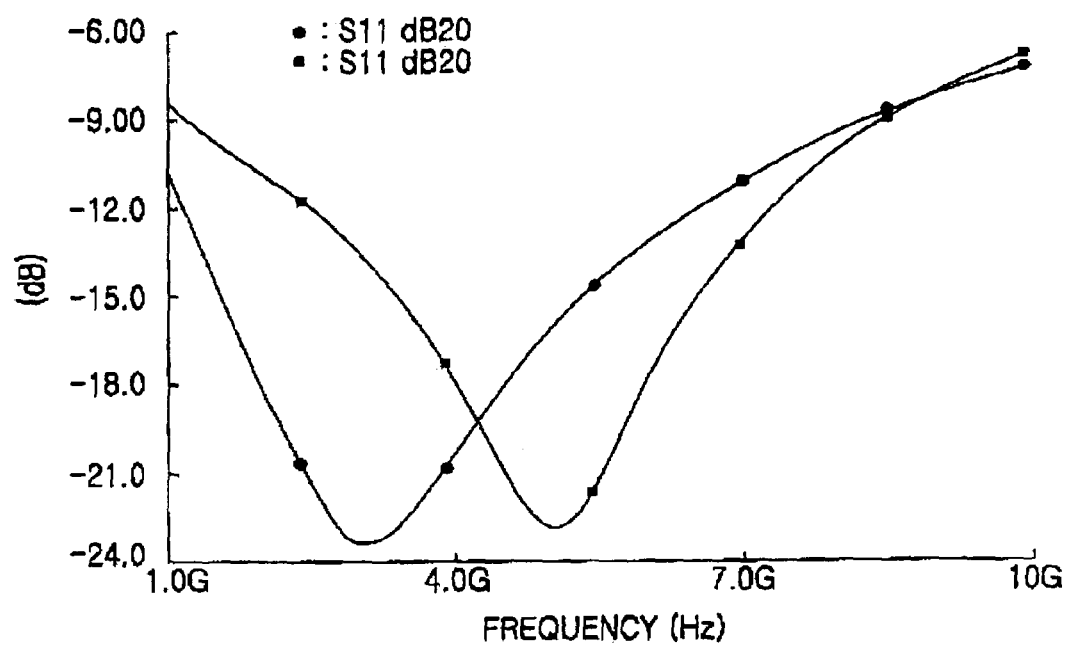
FIG. 4 is a graph showing a result of testing the performance of the multiband low noise amplifier according to a preferred embodiment of the present invention.

FIG. 4 is a graph showing a result of testing the performance of the multiband low noise amplifier according to a preferred embodiment of the present invention, in which changes in an S parameter (S11) are shown when two control voltage values are applied to a varactor.

As shown in FIG. 4, when a control voltage of 0V is applied to the varactor to select a low frequency band, the S parameter S11 points to −24 dB at 2.3 GHz. At this time, a gain is 22 dB and a noise index is 2 dB. When a control voltage of 1.8V is applied to the varactor to select a high frequency band, the S parameter S11 points to −20 dB at 5.2 GHz. At this time, a gain is 11.4 dB and a noise index is 3.3 dB.

As described above, in the multiband low noise amplifier according to a preferred embodiment of the present invention, a varactor having a variable capacitance is installed at an input end, thereby easily performing band switching through bias voltage control by a small amount and minimizing noises that may be caused by a control signal.

Moreover, in the multiband low noise amplifier according to a preferred embodiment of the present invention, since the varactor functions as a shunt feedback circuit, it does not affect the noise cancellation performance of the multiband low noise amplifier.

In addition, in the multiband low noise amplifier according to a preferred embodiment of the present invention, the same direct current condition is applied to multiple bands. Thus, it is possible to avoid performance degradation that may be caused by a change in the direct current condition.

While the invention has been shown and described with reference to a certain preferred embodiment thereof, it will be understood by those skilled in the art that various changes in form and details may be made therein without departing from the spirit and scope of the invention.

What is claimed is:

1. A multiband low noise amplifier, comprising:
   a first inductor having a first end as the input in the low noise amplifier;
   a first transistor including a collector electrically connected to a first power supply, a grounded emitter, and a base connected to a second end of the first inductor;
   an input matching circuit connected between the collector and the base of the first transistor;
   a first capacitor having a first end connected to the collector of the first transistor; and
   a second resistor serially connected between the collector and the first power supply.

2. The multiband low noise amplifier of claim 1, wherein the input matching circuit includes a varactor.

3. The multiband low noise amplifier of claim 2, wherein the input matching circuit includes a second capacitor connected in parallel with the varactor.

4. The multiband low noise amplifier of claim 2, wherein the input matching circuit includes a first resistor connected in series to the varactor.

5. The multiband low noise amplifier of claim 3, wherein the input matching circuit includes a first resistor connected in series with the varactor and the second capacitor.

6. The multiband low noise amplifier of claim 1, further comprising a second inductor serially connected between the emitter and a ground.

7. The multiband low noise amplifier of claim 1, further comprising a reverse isolator connected to a second end of the first capacitor.

8. The multiband low noise amplifier of claim 7, wherein the reverse isolator comprises:
   a second transistor including a base connected to a second power supply and a collector connected to a third power supply through a third capacitor;
   a third inductor connected in parallel with the third capacitor;
   a fourth capacitor connected in parallel with the third capacitor;
   a fourth inductor connected in series with the fourth capacitor; and
   a third transistor including a collector connected to an emitter of the second transistor, a base connected to the second end of the first capacitor, and a grounded emitter.

* * * * *